US008988113B2

(12) United States Patent
Soenen et al.

(10) Patent No.: US 8,988,113 B2
(45) Date of Patent: Mar. 24, 2015

(54) COMPARATOR CIRCUIT HAVING A CALIBRATION CIRCUIT

(71) Applicant: Taiwan Semiconductor Manufacturing Company, Ltd., Hsinchu (TW)

(72) Inventors: Eric Soenen, Austin, TX (US); Alan Roth, Leander, TX (US); Justin Shi, Ann Arbor, MI (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 34 days.

(21) Appl. No.: 13/804,641

(22) Filed: Mar. 14, 2013

(65) Prior Publication Data

US 2013/0241599 A1  Sep. 19, 2013

Related U.S. Application Data

(60) Provisional application No. 61/611,378, filed on Mar. 15, 2012.

(51) Int. Cl.
*H03K 5/22* (2006.01)
*H03K 3/013* (2006.01)
*H03K 5/24* (2006.01)

(52) U.S. Cl.
CPC . *H03K 3/013* (2013.01); *H03K 5/24* (2013.01)
USPC .................................. 327/63; 327/77; 327/87

(58) Field of Classification Search
USPC ................................................ 327/63, 77, 87
See application file for complete search history.

(56) References Cited

U.S. PATENT DOCUMENTS

| 6,608,582 | B2 * | 8/2003 | Casper et al. | 341/155 |
|---|---|---|---|---|
| 7,126,510 | B2 * | 10/2006 | Alon et al. | 341/120 |
| 7,622,963 | B2 * | 11/2009 | Westwick | 327/90 |
| 7,944,248 | B2 * | 5/2011 | Nguyen et al. | 327/73 |
| 2003/0090299 | A1 * | 5/2003 | Dathe et al. | 327/77 |
| 2013/0088375 | A1 * | 4/2013 | Wu et al. | 341/120 |

* cited by examiner

*Primary Examiner* — Quan Tra
(74) *Attorney, Agent, or Firm* — Lowe Hauptman & Ham, LLP

(57) ABSTRACT

A comparator has a first terminal, a second terminal, and an output terminal. A selection circuit is coupled to the first terminal. A calibration circuit is coupled to the output terminal and the second terminal. The comparator is configured to operate in a first mode when the selection circuit provides a first input signal to the first terminal and the calibration circuit provides a second input signal to the second terminal. The comparator is configured to operate in a second mode when the selection circuit provides a first calibration signal to the first terminal and the calibration circuit provides a second calibration signal to the second terminal based on an output signal at the output terminal. The comparator generates the output signal based on the first calibration signal and the second calibration signal.

20 Claims, 6 Drawing Sheets

COMPARATOR CIRCUIT HAVING A CALIBRATION CIRCUIT

CROSS-REFERENCE TO RELATED APPLICATION

The present application claims the priority of U.S. Provisional Application No. 61/611,378, filed Mar. 15, 2012, the disclosure of which is incorporated herein by reference in its entirety.

FIELD

The present disclosure is related to a comparator circuit having a calibration circuit.

BACKGROUND

Input offsets in comparators are common. Currently, it is difficult to have sub milli-volt (sub-mV) offsets in comparators made by complementary metal oxide silicon (CMOS) technology. In attempts to achieve such sub-mV offsets, complex circuitries are used, including, for example, correlated double sampling (CDS), chopping, etc. In a CDS technique, the comparator samples a reference voltage, then samples an input signal in every clock cycle. The comparator result is based on the difference between the reference voltage and the input signal. Sampling the reference voltage, however, is difficult. In a chopping technique, a fully-differential system is used. Both differential input signals and differential output signals are swapped at a certain rate. As a result, effects of an offset are cancelled. Further, fixed-pattern noise is added, which subsequently needs to be filtered out.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
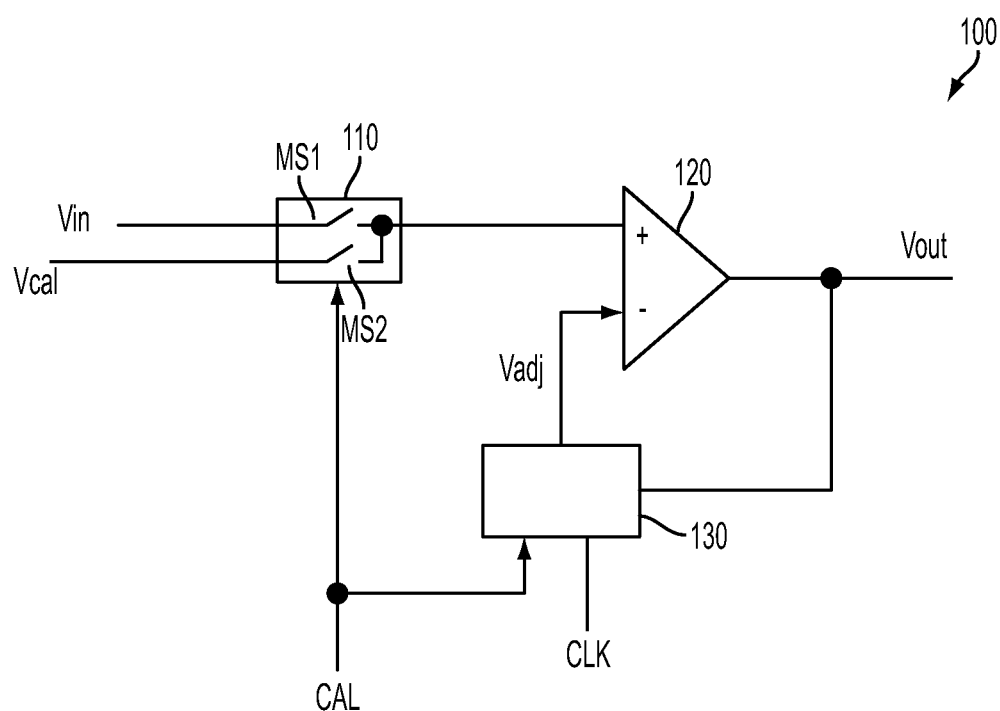
FIG. 1 is a diagram of a comparator circuit having a calibration circuit in a single-ended architecture, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. A voltage comparator circuit includes an adaptive calibration circuit. The resolution at the input of the comparator circuit is below one millivolt (mV). The comparator circuit is suitable for use in power management and analog to digital (AD) converters. In some embodiments, the comparator circuit has a separate input for offset control. The offset adjustment is done in spare cycles when the comparator circuit is not used for its normal comparison mode. An up-down counter circuit is used. The comparator circuit determines the direction for the up-down counter to adjust the offset. A step size for calibration adjustment can be made arbitrarily small. No filtering such as in a chopping technique is used. In some embodiments, switched capacitors are used to implement the offset calibration circuit that uses low overheads.

Comparator Circuit

For simplicity, in this document, a reference name is used for both a node (or a line) and the signal thereon. For example, in FIG. 1, Vout is used to refer to both the output node of a comparator 120 and the signal on the output node.

FIG. 1 is a diagram of a comparator circuit 100, in accordance with some embodiments. In some embodiments, comparator circuit 100 is used in power management systems. Other applications are within the scope of various embodiments.

A multiplexer 110 selects either a signal Vin or a signal Vcal to a non-inverting terminal V+ of a comparator 120. In some embodiments, signal Vin is selected for a normal comparison mode of comparator 120, and signal Vcal is selected for a calibration mode of comparator 120. Further, in at least one embodiment, ground or a voltage VSS (not labeled) is used as signal Vcal. In some embodiments, multiplexer 110 includes switches MS1 and MS2. For example, when switch MS2 is open and switch MS1 is closed, signal Vin is selected for terminal V+. But when switch MS1 is open and switch MS2 is closed, signal Vcal is selected for terminal V+.

Comparator 120 compares the signals at terminals V+ and V−, and generates a signal Vout at the output. If signal V+ is greater than signal V−, comparator 120 generates a high logical value for signal Vout. But if signal V+ is less than signal V−, comparator 120 generates a low logical value for signal Vout. When signal V+ and V− are about the same, comparator 120 is equally likely to produce the same number of high logical and low logical values. In such a condition, the voltage at node V+ (or node V−) is at a threshold of comparator 120.

In some embodiments, in the normal comparison mode of comparator 120, terminal V+ receives signal Vin, and terminal V− has a voltage a constant voltage value. In some embodiments, the constant voltage value is a voltage value of voltage Vadj after calibration. In contrast, in the calibration mode, terminal V+ receives signal Vcal. Based on signal Vout, up-down counter 130 provides voltage Vadj accordingly. In other words, voltage Vadj is adjusted based on signal Vout. For example, if voltage Vin is greater than voltage Vadj, signal Vout is logically high, and voltage Vadj is increased. In contrast, if voltage Vin is lower than voltage Vadj, signal Vout is logically low, and voltage Vadj is decreased. In some embodiments, voltage Vadj is adjusted once per clock cycle of a clock signal CLK. The output of multiplexer 110 at terminal V+ and voltage Vadj at terminal V− of comparator 120 are for illustration. The output of multiplexer 110 at terminal V− and voltage Vadj at terminal V+ of comparator 120 are within the scope of various embodiments. In such a condition, operations of comparator 120 are modified accordingly.

For various reasons, comparator 120 has an input offset at terminals V+ and V−. As a result, when the voltages at terminals V+ and V− are the same, comparator 120 tends to generate a particular logical value, such as a high logical value or a low logical value instead of equally providing the same number of high or low logical values. Up-down counter 130 is used to cancel the effect of the offset at terminals V+ and V−. Expressed differently, up-down counter 130 is used to calibrate comparator 120. In various embodiments, once calibration is complete, the input offset at terminals V+ and V− is canceled. Consequently, comparator 120 is equally likely to produce the same number of logical high and low values when terminals V+ and V− are applied with the same voltage value. Because voltage Vadj is used in calibrating comparator 120, voltage Vadj is also called a calibration voltage or a calibration signal.

In some embodiments, when a signal CAL is logically high, counter 130 is activated and comparator 120 operates in the calibration mode. But when signal CAL is logically low, counter 130 is deactivated, and comparator 120 operates in the normal comparison mode. In effect, signal CAL is used to control the operational modes of comparator 120. In various applications of comparator circuit 100, there are spare times when comparator 120 is not used, signal CAL is applied with a high logical value so that comparator 120 is calibrated in the calibration mode.

Up-Down Counter Circuit

Up-down counter 130 is also called a calibration circuit, an offset-adjusting circuit, etc. In some embodiments, up-down counter 130 is an analog circuit having an output voltage that can be adjusted up or down in small increments defined by capacitors C1 and C2 in FIG. 2 as explained below.

Figure 2:
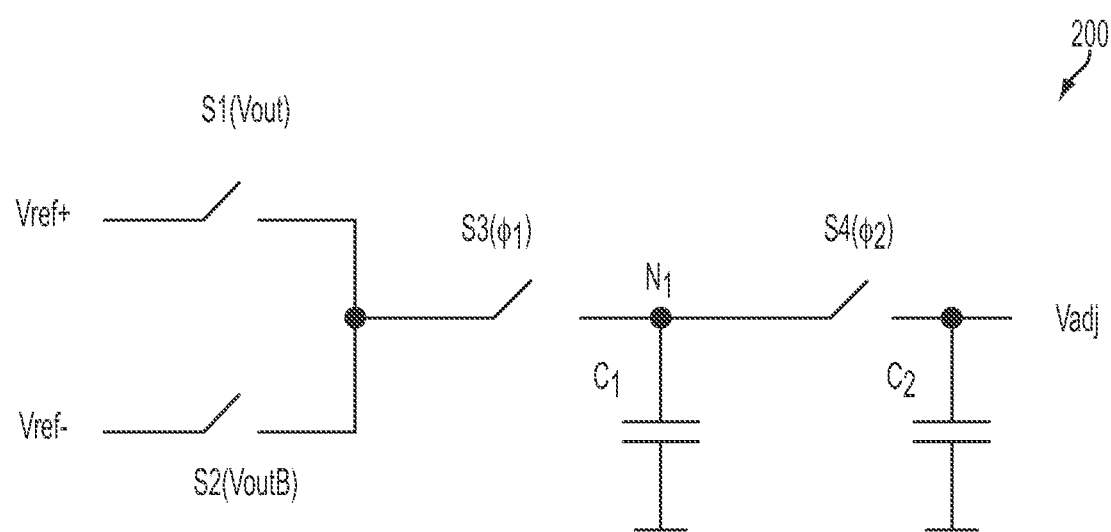
FIG. 2 is a diagram of the up-down counter in the comparator circuit in FIG. 1, in accordance with some embodiments.

FIG. 2 is a diagram of an up-down counter circuit 200, in accordance with some embodiments. Up-down counter circuit 200 is an implementation of up-down counter circuit 130 in FIG. 1.

A reference S1(Vout) indicates that switch S1 is closed when signal Vout in FIG. 1 is logically high. A reference S2(VoutB) indicates that switch S2 is closed when signal Vout is logically low. In some embodiments, counter circuit 200 operates in two different phases Φ1 and Φ2. A reference S3(Φ1) indicates that switch S3 operates in a first phase Φ1. In contrast, a reference S4(Φ2) indicates that switch S4 operates in a second phase Φ2. Because capacitors C1 and C2 are switched in phases Φ1 and Φ2, counter circuit 200 is called a switched-capacitor circuit, a capacitor-based integrator, etc.

Capacitor C1 stores a voltage at a node N1. Capacitor C2 stores voltage Vadj. In some embodiments, capacitor C2 is much larger than capacitor C1. For example, if Crat (not labeled) represents a ratio of a capacitance of capacitor C2 over a capacitance of capacitor C1, ratio Crat is about 40 to 100. For another example, if C1 is 100 fF and C2 is 4 pF, Crat is 40.

Switches S1, S2, and S3 function together to transfer a voltage Vref+ or a voltage Vref− to node N1. For example, in some embodiments, in the first phase Φ1, switch S3 is closed. When signal Vout in FIG. 1 is logically high, switch S2 is open and switch S1 is closed to transfer voltage Vref+ to node N1. In contrast, when switch S3 is closed, and when signal Vout is logically low, switch S1 is open and switch S2 is closed to transfer voltage Vref− to node N1.

A switch S4 is to transfer the voltage on node N1 to node Vadj. For example, after phase Φ1 is complete, node N1 has either voltage Vref+ or Vref−. Switch S3 is then open and switch S4 is closed to transfer either voltage Vref+ or Vref− at node N1 to node Vadj. As a result, after both phases Φ1 and Φ2 are complete, a scaled version of voltage Vref+ or voltage Vref− is added to voltage Vadj. For example, if |Vref| represents the absolute value of either voltage Vref+ or voltage Vref−, voltage Vadj is added with a scaled version of |Vref| or subtracted from a scaled version of |Vref|. In some embodiments, a scaling factor is determined based on ratio Crat. Further, to get a small adjustment, capacitor C1 is selected to be much smaller than capacitor C2. For example, in some embodiments, capacitor C1 is about 1% of capacitor C2. Effectively, when voltage Vout is logically high, voltage Vadj is increased by an amount of voltage |Vref|*C1/C2. But if voltage Vout is logically low, voltage Vadj is decreased by an amount of voltage |Vref|*C1/C2. Whether voltage Vout is logically high or low is determined by an output state of comparator 120 during each clock cycle of the calibration mode.

Differential Comparator Circuit

Persons of ordinary skill in the art will recognize that circuits 100 and 200 are each a single-ended system in which a voltage has a single representation. For example, the input voltage is represented by a single voltage Vin, voltage Vadj is represented by a single reference Vadj, etc.

Figure 3:
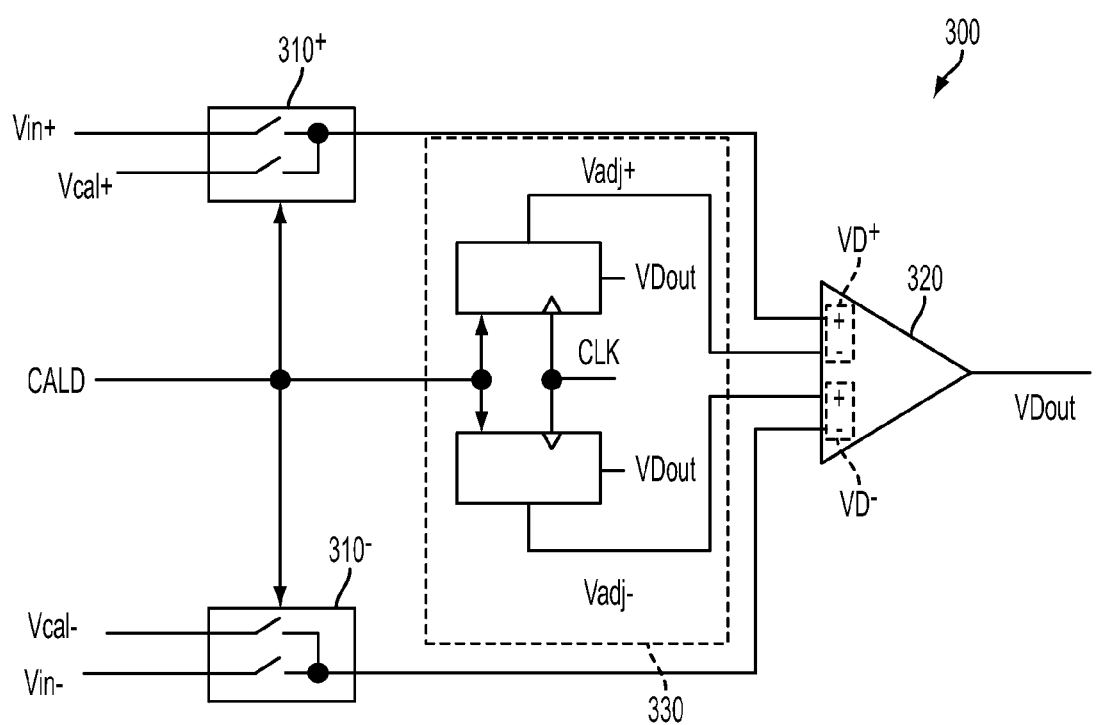
FIG. 3 is a diagram of a comparator circuit having a calibration circuit in a differential architecture, in accordance with some embodiments.

FIG. 3 is a diagram of a comparator circuit 300, in accordance with some embodiments. Comparator circuit 300 is differential in which a voltage is represented by a positive and a negative voltage having the same magnitude or absolute value. For example, voltage Vin is represented by a voltage Vin+ and a voltage Vin−, each having the same absolute value |Vin|. Similarly, voltage Vcal is represented by a voltage Vcal+ and a voltage Vcal−, each having the same absolute value |Vcal|. Voltage Vadj is represented by a voltage Vadj+ and a voltage Vadj−, each having the same absolute value |Vadj|, etc. Each of terminals V+ and V− of comparator 320 has a positive terminal and a negative terminal. For simplicity, both voltages Vcal+ and Vcal− are grounded and thus have 0 V. Other values of voltages Vcal+ and Vcal− are within the scope of various embodiments.

Compared with circuit 100, signals Vin+ and Vin− correspond to signal Vin in circuit 100. Signals Vcal+ and Vcal− correspond to signal Vcal. Signals Vadj+ and Vadj− correspond to signal Vadj. Multiplexers 310+ and 310− correspond to multiplexer 110. A terminal VD+ having a positive terminal and a negative terminal correspond to terminal V+. A terminal VD− having a positive terminal and a negative terminal correspond to terminal V−.

Circuit 300 operates in a manner similar to circuit 100, except that circuit 100 is single-ended while circuit 300 is differential. For example, when a signal CALD is logically low, circuit 300 operates in a normal comparison mode, multiplexer 310+ selects signal Vin+ to the positive terminal of terminal VD+ of comparator 320, and multiplexer 310− selects signal Vin− to the negative terminal of terminal VD− of comparator 320. Comparator 320 then compares the difference of voltages Vin+ and Vin− and the difference of voltages Vadj+ and Vadj−. In other words, if ΔVin represents the difference between Vin+ and Vin− and ΔVadj represents the difference between Vadj+ and Vadj−, comparator 320 compares ΔVin and ΔVadj.

In contrast, when signal CALD is logically high, circuit 300 operates in a calibration mode. Multiplexer 310+ selects signal Vcal+ to the positive terminal of terminal VD+, and multiplexer 310− selects signal Vcal− to the negative terminal of terminal VD−. When signal VDout is logically high, signal Vadj+ at the negative terminal of terminal VD+ is increased while signal Vadj− at the positive terminal of terminal VD− is decreased. Effectively, the absolute value |ΔVadj| is increased. In contrast, when signal VDout is logically low, signal Vadj+ is decreased and signal Vadj− is increased. Effectively, the absolute value |ΔVadj| is decreased.

UP-Down Counter Circuit with Differential Voltages

Figure 4:
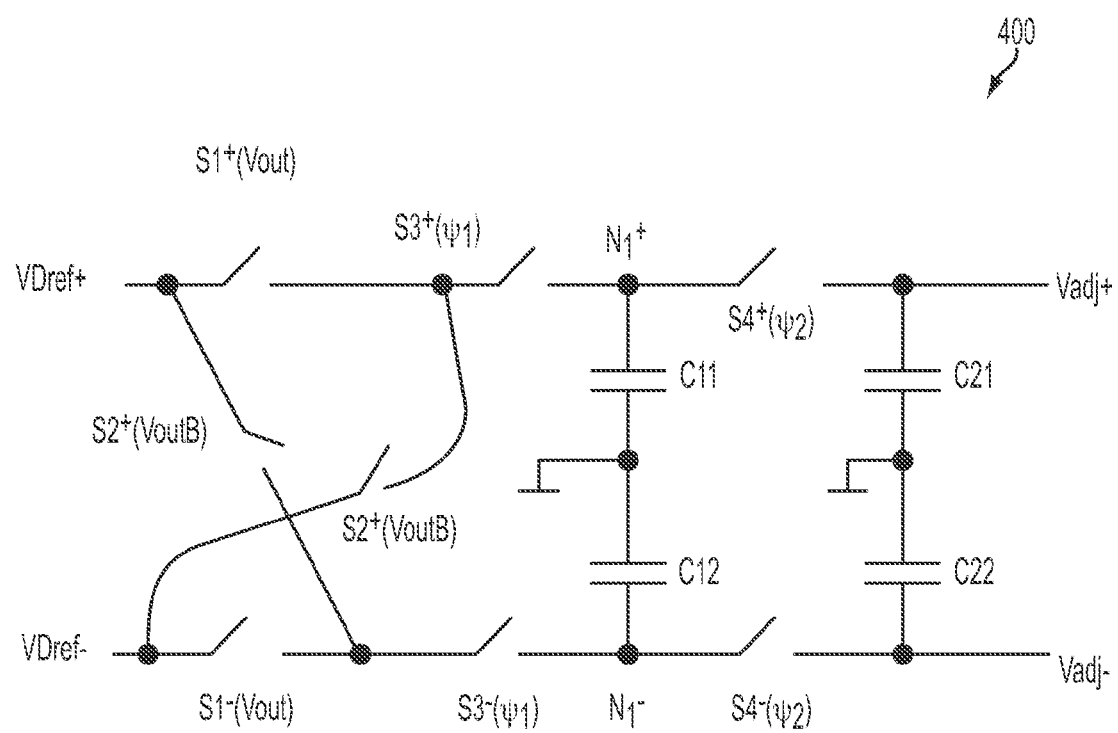
FIG. 4 is a diagram of an up-down counter of the comparator circuit in FIG. 3, in accordance with some embodiments.

FIG. 4 is a diagram of an up-down counter circuit 400, in accordance with some embodiments. Circuit 400 is an implementation of circuit 330, and is also differential.

References S1+(VDout) and S1−(VDout) indicate that both switches S1+ and S1− are closed when signal VDout is logically high. References S2+(VDoutB) and S2− (VDoutB) indicate that both switches S2+ and S2− are closed when signal VDout is logically low. References S3+(Ψ1) and S3−(Ψ−1) indicate that switches S3+ and S3− are closed in a first phase Ψ1 of circuit 400. References S4+(Ψ2) and S4−(Ψ2) indicate that switches S4− and S4− are closed in a second phase Ψ2 of circuit 400.

Compared with circuit 200, voltages VDref+ and VDref− correspond to voltages Vref+ and Vref− in circuit 200, respectively. Switches S1+ and S1− correspond to switch S1. Switches S2+ and S2− correspond to switch S2. Switches S3+ and S3− correspond to switch S3. Switches S4+ and S4− correspond to switch S4. Capacitors C11 and C12 correspond to capacitor C1. Capacitors C21 and C22 correspond to capacitor C2. Nodes N1+ and N1− correspond to node N1. Nodes Vadj+ and Vadj− correspond to node Vadj.

In the calibration mode, when signal VDout is logically high, switches S2+ and S2− are open. Switches S1+ and S1− are closed. In the first switching phase Ψ1, switches S3+ and S3− are closed. Voltages VDref+ and VDref− are transferred to nodes N1+ and N1−, respectively. After phase Ψ1 is complete, switches S3+ and S3− are open, and switches S4+ and S4− are closed. As a result, voltages N1+ and N1− are transferred to nodes Vadj+ and Vadj−, respectively. Effectively, voltage Vadj+ is increased and voltage Vadj− is decreased, and the absolute value |Vadj| is increased.

In contrast, when signal VDout is logically low, switches S1+ and S1− are open. Switches S2+ and S2− are closed. In the first switching phase Ψ1, switches S3+ and S3− are closed. Voltages VDref− and VDref+ are transferred to nodes N1+ and N1−, respectively. After phase Ψ1 is complete, switches S3+ and S3− are open, and switches S4+ and S4− are closed. As a result, voltages N1+ and N1− are transferred to node Vadj+ and Vadj−, respectively. Effectively, voltage Vadj is decreased and voltage Vadj− is increased, and the absolute value |Vadj| is decreased.

Methods

Figure 5:
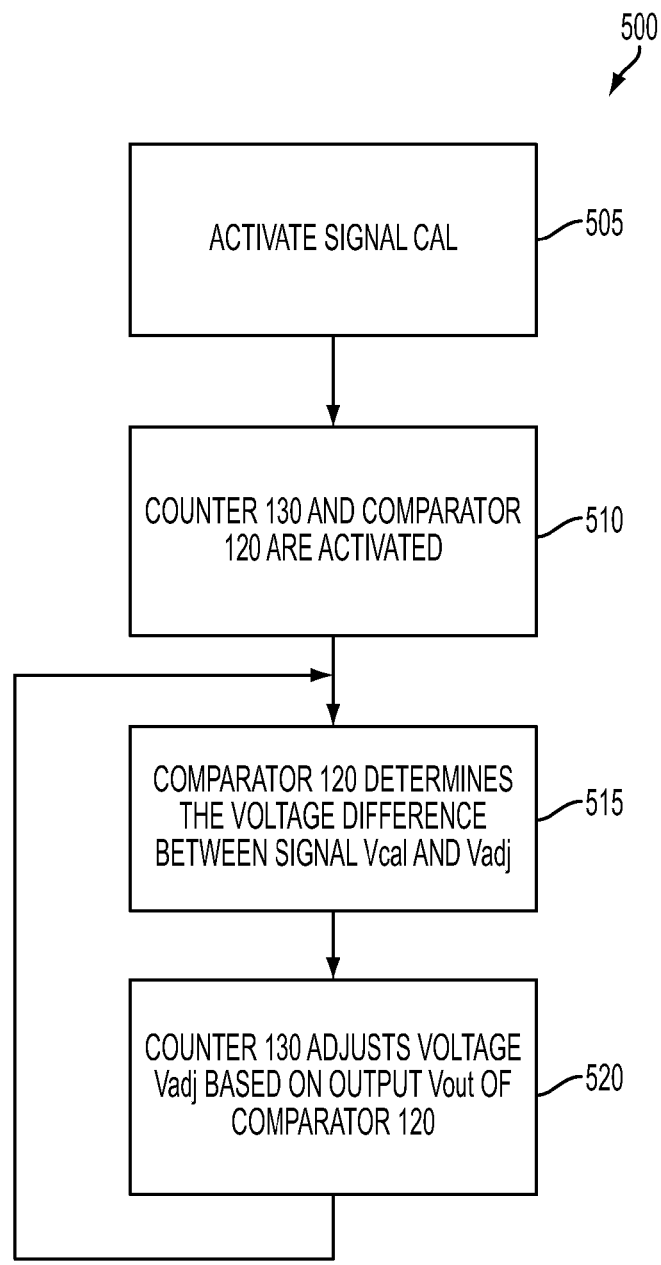
FIG. 5 is a flowchart of a method illustrating the circuit in FIG. 1 operating in a calibration mode, in accordance with some embodiments.

FIG. 5 is a flowchart of a method 500 illustrating an operation of comparator circuit 100, in accordance with some embodiments. In this illustration, comparator circuit 100 operates in the calibration mode, and counter 200 is implemented as counter 130. In some embodiments, the calibration mode is selected at a time when comparator circuit 100 does not need to perform a comparison of voltages.

In operation 505, signal CAL is activated with a high logical value. As a result, multiplexer 110 selects signal Vcal to be input to terminal V+ of comparator 120.

In operation 510, based on signal CAL being activated, counter 130 is activated, and comparator 120 is in the calibration mode.

In operation 515, comparator 120 determines the voltage difference between voltage Vcal and voltage Vadj.

In operation 520, counter 130 adjusts voltage Vadj based on output Vout of comparator 120. For example, if voltage Vcal is greater than voltage Vadj, signal Vout is logically high. As a result, counter 130 increases voltage Vadj. But if voltage Vcal is less than voltage Vadj, counter 130 decreases voltage Vadj.

Operations 515 and 520 are repeated until calibration is done. In some embodiments, output Vout of comparator 120 is checked to determine whether the number of logical high decisions is approximately equal to the number of logical low decisions. In other words, the calibration is done when comparator 120 is equally likely to generate a high logical value and a low logical value at output Vout. In some other embodiments, the calibration mode is kept active for a time long enough such that, based on a theoretical analysis of circuit 100 and a system using circuit 100, the number of logical high decisions is approximately equal to the number of logical low decisions.

Figure 6:
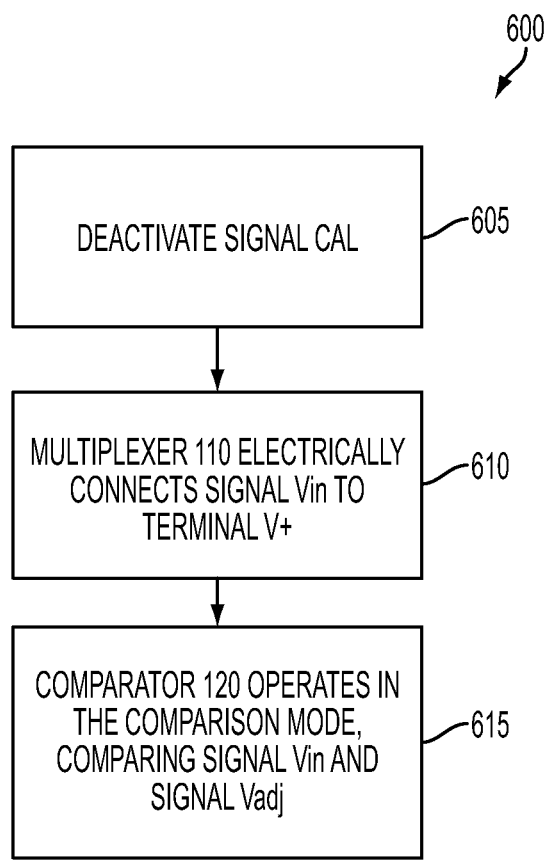
FIG. 6 is a flowchart of a method illustrating the circuit in FIG. 1 operating in a normal comparison mode, in accordance with some embodiments.

FIG. 6 is a flowchart of a method 600 illustrating an operation of circuit 100, in accordance with some embodiments. In this illustration, circuit 100 operates in the normal comparison mode. Comparator 120 has been calibrated using the method in FIG. 5.

In operation 605, signal CAL is deactivated with a low logical value. As a result, counter 130 is disabled. Comparator 120 operates in the normal comparison mode. In such a condition, in some embodiments, voltage Vadj is at a constant voltage level. In some embodiments, the normal comparison mode is selected when comparator 100 is to perform a comparison between two signals that is close to each other, such as, for example, in some precision analog to digital converters, in power management circuits where the direction of a current is determined based on a voltage drop across a small resistor.

In operation 610, based on the deactivated signal CAL, multiplexer 110 electrically couples signal Vin to non-inverting terminal V+ of comparator 120.

In operation 615, comparator 120 operates normally as a comparator having signals Vin and Vadj as inputs. Operations of comparator 120 should be recognizable by persons of ordinary skill in the art.

In FIGS. 5 and 6, circuits 100 and 200 are used for illustration. Operations of circuits 300 and 400 are similar but in differential architecture, and should be recognizable by persons of ordinary skill in the art.

A number of embodiments have been described. It will nevertheless be understood that various modifications may be made without departing from the spirit and scope of the disclosure. For example, the low or high logical values of various signals used in the above description are for illustration. Various embodiments are not limited to a particular level when a signal is activated and/or deactivated. Selecting different levels is within the scope of various embodiments.

In some embodiments, a comparator circuit comprises a comparator, a selection circuit, and a calibration circuit. The comparator has a first terminal, a second terminal, and an output terminal. The selection circuit is coupled to the first terminal. The calibration circuit is coupled to the output terminal and the second terminal. The comparator is configured to operate in a first mode when the selection circuit is configured to provide a first input signal to the first terminal of the comparator and the calibration circuit is configured to provide a second input signal to the second terminal of the comparator. The comparator is configured to operate in a second mode when the selection circuit is configured to provide a first calibration signal to the first terminal of the comparator and the calibration circuit is configured to provide a second calibration signal to the second terminal of the comparator based on an output signal at the output terminal of the comparator. The comparator is configured to generate the output signal based on the first calibration signal and the second calibration signal.

In some embodiments regarding a method, a first input signal or a first calibration signal is selectively provided to a first terminal of a comparator. The comparator is caused to operate in a first mode of operation and a second mode of operation. In the first mode of operation, the first terminal receives the first input signal and the second terminal receives a second input signal. In the second mode of operation, the first terminal receives the first calibration signal and the second terminal receives a variable signal. The variable signal varies based on a signal at an output terminal of the comparator. The signal at the output terminal of the comparator is generated based on a voltage difference between the first calibration signal and the variable signal.

In some embodiments regarding method, a comparator is caused to operate in a first mode of operation and a second mode of operation. In the first mode of operation, the comparator receives a first input signal at a first terminal and a second input signal at a second terminal. In the second mode of operation, the comparator receives a first calibration signal at the first terminal and a second calibration signal at the second terminal. The second calibration signal is adjusted by a capacitive-switching circuit based on a logical value of a signal at the output of the comparator.

Various figures show the capacitor circuits using discrete capacitors for illustration. Equivalent circuitry may be used. For example, a capacitive device, circuitry or network (e.g., a combination of capacitors, capacitive devices, circuitry, etc.) can be used in place of the capacitor.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A comparator circuit comprising:
    a comparator having a first terminal, a second terminal, and an output terminal;
    a selection circuit coupled to the first terminal; and
    a calibration circuit coupled to the output terminal and the second terminal,
    wherein
        the comparator is configured to operate in a first mode when
            the selection circuit is configured to provide a first input signal to the first terminal of the comparator;
            the calibration circuit is configured to provide a second input signal to the second terminal of the comparator;
        the comparator is configured to operate in a second mode when
            the selection circuit is configured to provide a first calibration signal to the first terminal of the comparator and the calibration circuit is configured to provide a second calibration signal to the second terminal of the comparator based on an output signal at the output terminal of the comparator; and
            the comparator is configured to generate the output signal based on the first calibration signal and the second calibration signal;
    the calibration circuit includes
        a first node coupled to a first capacitive circuit; and
        a second node coupled to a second capacitive circuit;
        in a first phase of operation, the calibration circuit is configured to selectively receive at the first node a first reference voltage or a second reference voltage based on the output signal at the output terminal of the comparator, the first and second reference voltages having different voltage levels; and
        in a second phase of operation, the calibration circuit is configured to transfer a voltage at the first node to the second node.

2. The comparator circuit of claim 1, wherein the calibration circuit further includes
    a first switch being controlled based on the output signal at the output terminal of the comparator, a first end of the first switch configured to receive the first reference voltage;
    a second switch being controlled based on the output signal at the output of terminal the comparator, a first end of the second switch configured to receive the second reference voltage, a second end of the second switch coupled to a second end of the first switch;
    a third switch being controlled based on a first phase of operation of the calibration circuit, a first end of the third switch coupled to the second end of the first switch and of the second switch, a second end of the third switch coupled to the first node; and
    a fourth switch being controlled based on a second phase operation of the calibration circuit, a first end of the fourth coupled to the first node, a second end of the fourth switch coupled to the second node.

3. The comparator circuit of claim 2, wherein
    a ratio of first capacitance of the first capacitive circuit and second capacitance of the second capacitive circuit is determined based on a predetermined adjustment value for the second calibration signal.

4. The comparator circuit of claim 1, wherein
    the calibration circuit is configured to provide the second calibration signal further based on a clock signal.

5. The circuit of claim 1, wherein
    the calibration circuit is configured to increase a voltage level of the second calibration signal based on a first logical value of the output signal at the output terminal of the comparator and to decrease the voltage level of the second calibration signal based on a second logical value of the output signal at the output terminal of the comparator.

6. The comparator circuit of claim 1, wherein
    the first calibration signal is electrical ground.

7. The comparator circuit of claim 1, wherein
    the second input signal is a constant signal when the comparator is operated under the first mode.

8. The comparator circuit of claim 1, wherein
    the first terminal and the second terminal are each configured to receive a single-ended or a differential signal.

9. The comparator circuit of claim 1, wherein the calibration circuit further includes
    a third node, the first capacitive circuit coupled to the first node and the third node;
    a fourth node, the second capacitive circuit coupled to the second node and the fourth node;

a first positive switch being controlled based on the output signal at the output terminal of the comparator, a first end of the first positive switch configured to receive the first reference voltage;

a first negative switch being controlled based on the output signal at the output terminal of the comparator, a first end of the first negative switch configured to receive the second reference voltage;

a second positive switch being controlled based on the output signal at the output terminal of the comparator, a first end of the second positive switch configured to receive the first reference voltage, a second end of the second positive switch coupled to a second end of the first negative switch;

a second negative switch being controlled based on the output signal at the output terminal of the comparator, a first end of the second negative switch configured to receive the second reference voltage, a second end of the second negative switch coupled to a second end of the first positive switch;

a third positive switch being controlled based on a first phase of operation of the calibration circuit, a first end of the third positive switch coupled to the second end of the first positive switch and of the second negative switch, a second end of the third positive switch coupled to the first node;

a third negative switch being controlled based on the first phase of operation of the calibration circuit, a first end of the third negative switch coupled to the second end of the first negative switch and of the second positive switch, a second end of the third negative switch coupled to the third node;

a fourth positive switch being controlled based on a second phase operation of the calibration circuit, a first end of the fourth positive switch coupled to the first node, a second end of the fourth positive switch coupled to the second node; and a fourth negative switch being controlled based on the second phase operation of the calibration circuit, a first end of the fourth negative switch coupled to the third node, a second end of the fourth negative switch coupled to the fourth node.

10. The comparator circuit of claim 9, wherein
the first capacitive circuit comprises a first capacitive device and a second capacitive device;
a first end of the first capacitive device is coupled to the first node;
a first end of the second capacitive device is coupled to the second node;
a second end of the first capacitive device is coupled to a second end of the second capacitive device;
the second capacitive circuit comprises a third capacitive device and a fourth capacitive device;
a first end of the third capacitive device is coupled to the second node;
a first end of the fourth capacitive device is coupled to the fourth node; and
a second end of the third capacitive device is coupled to a second end of the fourth capacitive device.

11. A method comprising:
selectively providing a first input signal or a first calibration signal to a first terminal of a comparator; and
causing the comparator to operate in a first mode of operation and a second mode of operation,
wherein in the first mode of operation, the first terminal receives the first input signal and a second terminal of the comparator receives a second input signal;

in the second mode of operation,
the first terminal receives the first calibration signal and the second terminal receives a variable signal;
the variable signal varies based on a signal at an output terminal of the comparator; and
the signal at the output terminal of the comparator is generated based on a voltage difference between the first calibration signal and the variable signal;

the variable signal varies based on a calibration circuit, the calibration circuit comprising
a first node coupled to a first capacitive circuit; and
a second node coupled to a second capacitive circuit;

in a first phase of operation, the calibration circuit is configured to selectively receive at the first node a first reference voltage or a second reference voltage based on the signal at the output terminal of the comparator, the first and second reference voltages having different voltage levels; and in a second phase of operation, the calibration circuit is configured to transfer a voltage at the first node to the second node.

12. The method of claim 11, wherein the variable signal varies further based on a clock cycle of a clock signal.

13. The method of claim 11, wherein the first calibration signal is electrical ground.

14. The method of claim 11, wherein
the variable signal is increased based on a first logical value of the signal at the output terminal of the comparator and is decreased based on a second logical value of the signal at the output terminal of the comparator.

15. The method of claim 11, wherein the calibration circuit further comprising
a third node, the first capacitive circuit coupled to the first node and the third node;
a fourth node, the second capacitive circuit coupled to the second node and the fourth node;
a first positive switch being controlled based on the signal at the output terminal of the comparator, a first end of the first positive switch configured to receive the first reference voltage;
a first negative switch being controlled based on the signal at the output terminal of the comparator, a first end of the first negative switch configured to receive the second reference voltage;
a second positive switch being controlled based on the signal at the output terminal of the comparator, a first end of the second positive switch configured to receive the first reference voltage, a second end of the second positive switch coupled to a second end of the first negative switch;
a second negative switch being controlled based on the signal at the output terminal of the comparator, a first end of the second negative switch configured to receive the second reference voltage, a second end of the second negative switch coupled to a second end of the first positive switch;
a third positive switch being controlled based on a first phase of operation of the calibration circuit, a first end of the third positive switch coupled to the second end of the first positive switch and of the second negative switch, a second end of the third positive switch coupled to the first node;
a third negative switch being controlled based on the first phase of operation of the calibration circuit, a first end of the third negative switch coupled to the second end of the first negative switch and of the second positive switch, a second end of the third negative switch coupled to the third node;

a fourth positive switch being controlled based on a second phase operation of the calibration circuit, a first end of the fourth positive switch coupled to the first node, a second end of the fourth positive switch coupled to the second node; and a fourth negative switch being controlled based on the second phase operation of the calibration circuit, a first end of the fourth negative switch coupled to the third node, a second end of the fourth negative switch coupled to the fourth node.

16. The method of claim 11, wherein
the first input signal and the second input signal are each a single-ended signal or a differential signal.

17. A method comprising:
causing a comparator to operate in a first mode of operation and a second mode of operation,
wherein
   in the first mode of operation,
      the comparator receives a first input signal at a first terminal and a second input signal at a second terminal; and
   in the second mode of operation,
      the comparator receives a first calibration signal at the first terminal and a second calibration signal at the second terminal;
      the second calibration signal is adjusted by a capacitive-switching circuit based on a logical value of a signal at an output terminal of the comparator;
      in a first phase of operation, the capacitive-switching circuit generates a first voltage at a first capacitive node; and
      in a second phase of operation, the first voltage at the first capacitive node is transferred to a second capacitive node;
the first input signal, the second input signal, and the calibration signal are each a single-ended or a differential signal; and
the first terminal and the second terminal each receives a single-ended or a differential signal.

18. The method of claim 17, further comprising:
causing the capacitive-switching circuit to operate at the first phase operation in response to a first state of a clock signal; and
causing the capacitive-switching circuit to operate at the second phase operation in response to a second state of the clock signal.

19. The method of claim 17, further comprising:
causing the first capacitive node to receive a first reference voltage if the logical value of the signal at the output terminal of the comparator is a first logical value; and
causing the first capacitive node to receive a second reference voltage if the logical value of the signal at the output terminal of the comparator is a second logical value, the first and second reference voltages having different voltage levels.

20. The method of claim 17, further comprising:
causing the first terminal of the comparator to receive the first input signal through a selection circuit in response to a first state of a control signal; and
causing the first terminal of the comparator to receive the first calibration signal through the selection circuit in response to a second state of the control signal.

* * * * *